United States Patent [19]

Storz et al.

[11] Patent Number: 5,012,204
[45] Date of Patent: Apr. 30, 1991

[54] PHASE CONTROL CIRCUIT FOR REGULATING A CD PLAYER DRIVE

[75] Inventors: Dieter Storz, Lauterbach; Baas, Dieter, Kehl, both of Fed. Rep. of Germany

[73] Assignee: Deutsche Thomson-Brandt GmbH, Villingen-Schwenningen, Fed. Rep. of Germany

[21] Appl. No.: 460,930
[22] PCT Filed: May 26, 1989
[86] PCT No.: PCT/EP89/00590
§ 371 Date: Feb. 12, 1990
§ 102(e) Date: Feb. 12, 1990
[87] PCT Pub. No.: WO89/12932
PCT Pub. Date: Dec. 18, 1989

[30] Foreign Application Priority Data

Jun. 16, 1988 [DE] Fed. Rep. of Germany ....... 3820477

[51] Int. Cl.$^5$ ...................... H03L 7/087; G11B 19/28
[52] U.S. Cl. ......................... 331/11; 331/14; 331/17; 331/25; 388/911
[58] Field of Search .................. 331/10, 11, 12, 14, 331/17, 25; 388/911

[56] References Cited

U.S. PATENT DOCUMENTS 4,388,596  6/1983  Yamashita ...................... 331/11 X

FOREIGN PATENT DOCUMENTS 0049136  4/1982  European Pat. Off. .
59-227069A  12/1984  Japan .
61-24055A  2/1986  Japan .
2128780  5/1984  United Kingdom .

Primary Examiner—Siegfried H. Grimm
Attorney, Agent, or Firm—Max Fogiel

[57] ABSTRACT

A phase control circuit in which a first phase comparator compares an input frequency with a reference frequency. The output of the first phase comparator is connected to a controlled oscillator through a control stage. A second control stage is also connected to the input of the controlled oscillator which has an output connected to a second phase comparator which receives also the reference frequency at an input. The output of the second phase comparator is connected to an input of the second control stage. The first control stage is separated from the controlled oscillator to compensate the circuit automatically. The second control stage varies its output until the frequency at the controlled oscillator output equals the reference frequency. The second control stage maintains this level subsequent to compensation independent of the output from the second phase comparator, and the first control stage is reconnected to the input terminal of the controlled oscillator.

12 Claims, 3 Drawing Sheets

PHASE CONTROL CIRCUIT FOR REGULATING A CD PLAYER DRIVE

BACKGROUND OF THE INVENTION

The invention concerns a phase-control circuit wherein the output terminal of a phase comparator that compares the actual frequency with the reference frequency is connected to the input terminal of a controlled oscillator.

U. Tietze and Ch. Schenk describe a phase-control circuit, called a phase-locked loop, on pages 683 to 684 of Halbleiter-Schaltungstechnik, 4th ed., Springer, 1978.

Phase-locked loops, often abbreviated PLL, are employed in compact-disk players for example to obtain a synchronizing signal for controlling the speed of a disk drive from the EFM signal, the data signal coded in accordance with an eight-to-fourteen code and optically read from the disk. The speed must be controlled in order to keep the data flowing at a constant bit rate.

One drawback is that the controlled oscillator in the loop must be adjusted to the reference frequency by compensating it manually when the player is manufactured, and manual adjustments are always complicated and expensive.

Another drawback becomes apparent only once the compact-disk player has been operating for a while, when the parameters for the individual components of the loop vary over time as the result of temperature drift or aging of the components and lead to a gradually and initially almost imperceptible deterioration in sound reproduction.

SUMMARY OF THE INVENTION

The object of the invention is accordingly to eliminate the disadvantageous manual adjustment of a phase-locked loop and to ensure smooth operation as independent as possible of component aging and temperature drift.

This object is attained in accordance with the invention in that the output terminal of another control stage is connected to the input terminal of the controlled oscillator, in that the output terminal from the controlled oscillator is connected to one input terminal of another phase comparator, the second input terminal of which is supplied with reference frequency and the output terminal of which is connected to the input terminal of the second control stage, in that the first control stage is separated from the controlled oscillator to compensate the loop automatically, in that the second control stage varies its output until the frequency at the output terminal from the controlled oscillator equals the reference frequency, and in that the second control stage retains this level subsequent to compensation independent of the output from the second phase comparator and the first control stage is reconnected to the input terminal of the controlled oscillator.

DESCRIPTION OF THE PREFERRED EMBODIMENTS

The invention will now be described and its function explained with reference to the embodiment illustrated in FIG. 1.

Figure 1:
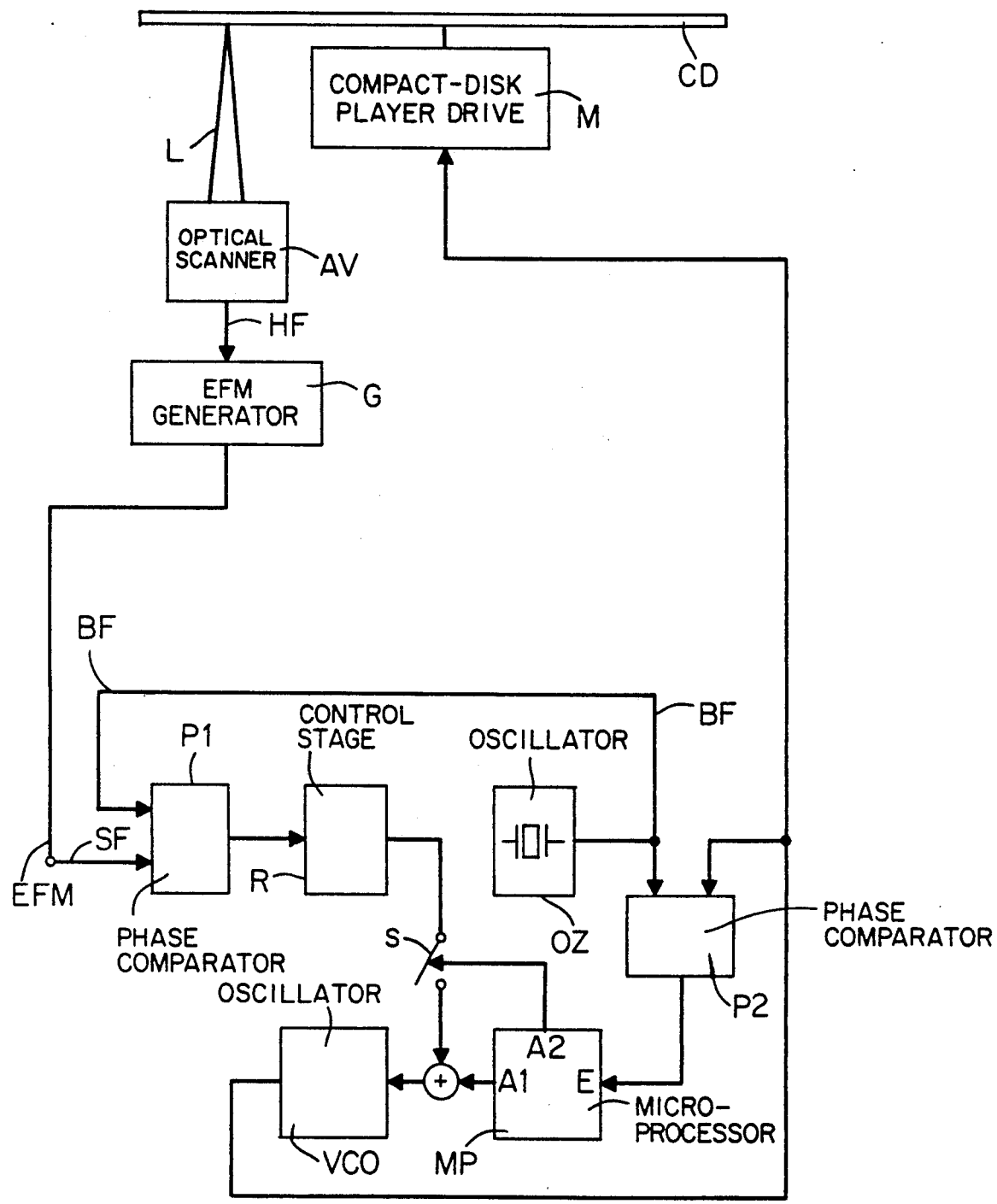
FIG. 1 is a schematic block diagram showing the essential elements of one embodiment according to the present invention.

The EFM signal in FIG. 1 is supplied to the input terminal of a phase comparator P1, the output terminal of which is connected to the input terminal of a control stage R. The output terminal of a quartz oscillator OZ that generates a reference frequency BF is connected to the second input terminal of phase comparator P1 and to the second input terminal of another phase comparator P2, the first input terminal of which is connected to the output terminal of a controlled oscillator VCO, a voltage-controlled oscillator for example, which is connected to the output terminal of another control stage in the form of a microprocessor MP and by way of a controlled switch S to the output terminal of first control stage R. The input terminal E of microprocessor MP is connected to the output terminal of phase comparator P2. The control input terminal of controlled switch S is connected to the second output terminal A2 of microprocessor MP.

To compensate the phase-locked loop, microprocessor MP opens controlled switch S, disengaging the output terminal of first control stage R from the input terminal of controlled oscillator VCO, and varies the voltage at its output terminal A1 until the frequency at the output terminal of voltage-controlled oscillator VCO equals the reference frequency BF from quartz oscillator OZ. Microprocessor MP now retains this voltage at its output terminal A1 and closes controlled switch S. The phase-locked loop is now compensated and ready to operate.

In using the loop of the present invention in conjunction with a compact-disk player M, data tracks of a compact disk CD are scanned by a light beam L of an optical scanner AV. The optical scanner provides a data signal HF at its output, which corresponds to the compact disk standard and coded in accordance with an eight-to-fourteen code. The EFM signal is generated from the data signal HF by the generator G. The loop can for example be automatically compensated every time the compact-disk player M is turned on. It can, however, on the other hand be compensated before any disk CD is played or while no data are being played back, during the interval between two pieces of music for instance. Compensation can even be carried out while the player's pick-up is in the ready position, while the operator is entering instructions for example. The loop is compensated in two further embodiments when the error rate in the data signal HF exceeds a prescribed threshold or when the compact-disk player breaks down completely. The compensation can also be carried out while the player is skipping from one track to another.

When the loop is compensated while the disk drive is in operation, between two pieces of music for example, the speed established just prior to compensation is retained in another embodiment for the duration of the compensation. This approach provides the advantage in a constant-velocity system that the speed of rotation will be in the vicinity of the intended speed subsequent to compensation.

A combination of all the characteristics described above is of course also possible. When a compact-disk player is equipped with the phase-locked loop in accordance with the invention, not only is the troublesome manual compensation during the manufacturing process no longer necessary but the repeated recompensation will ensure constant good sound reproduction because changes in the parameters of individual components due to aging or temperature fluctuations will always be corrected.

Figure 2:
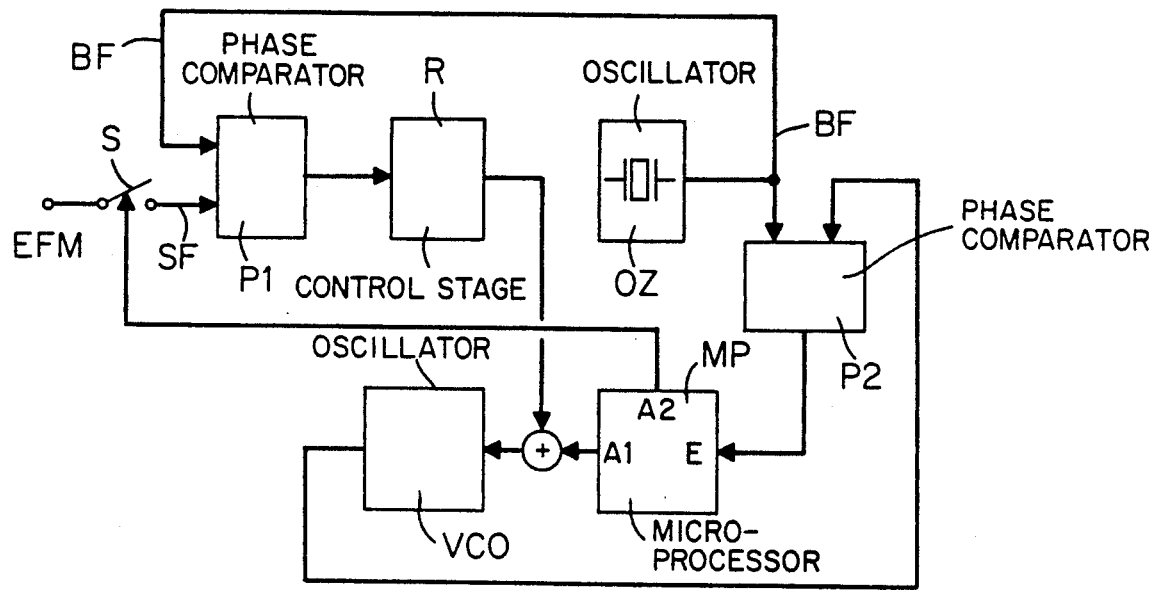
FIG. 2 is a schematic block diagram showing the essential elements of another embodiment of the present invention
Figure 3:
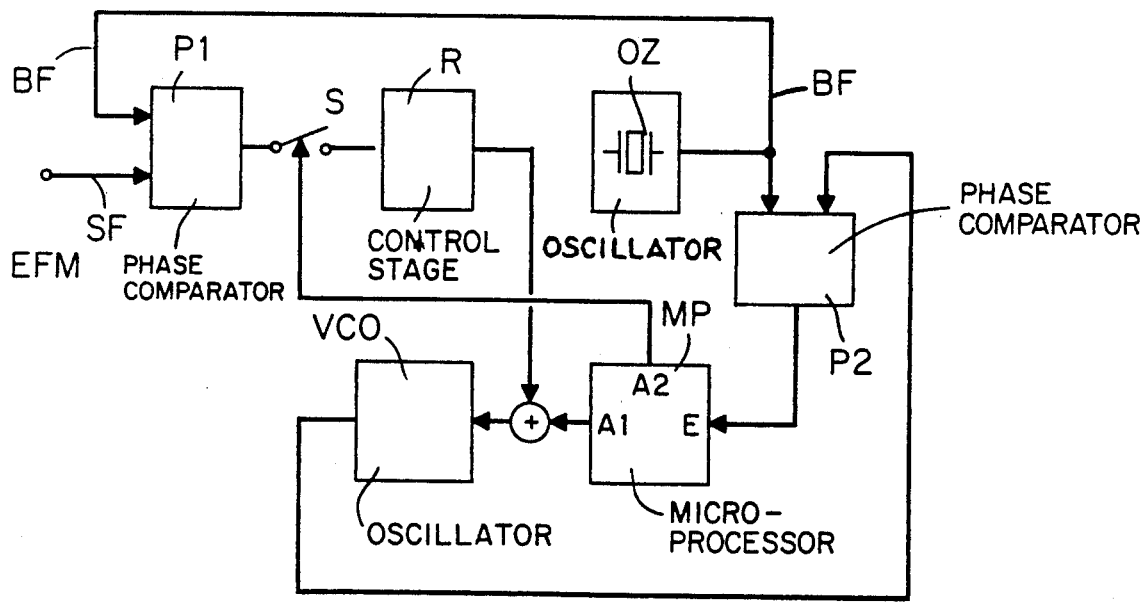
FIG. 3 is a schematic block diagram showing the essential elements of a third embodiment.

Controlled switch S can be either upstream of the first input terminal of phase comparator P1 as illustrated in FIG. 2 or, as illustrated in FIG. 3, between phase comparator P1 and first control stage R. The resistance of the output terminal of control stage R is low when controlled switch S is closed and high when it is open. The stage is accordingly active only in the former case.

Figure 4:
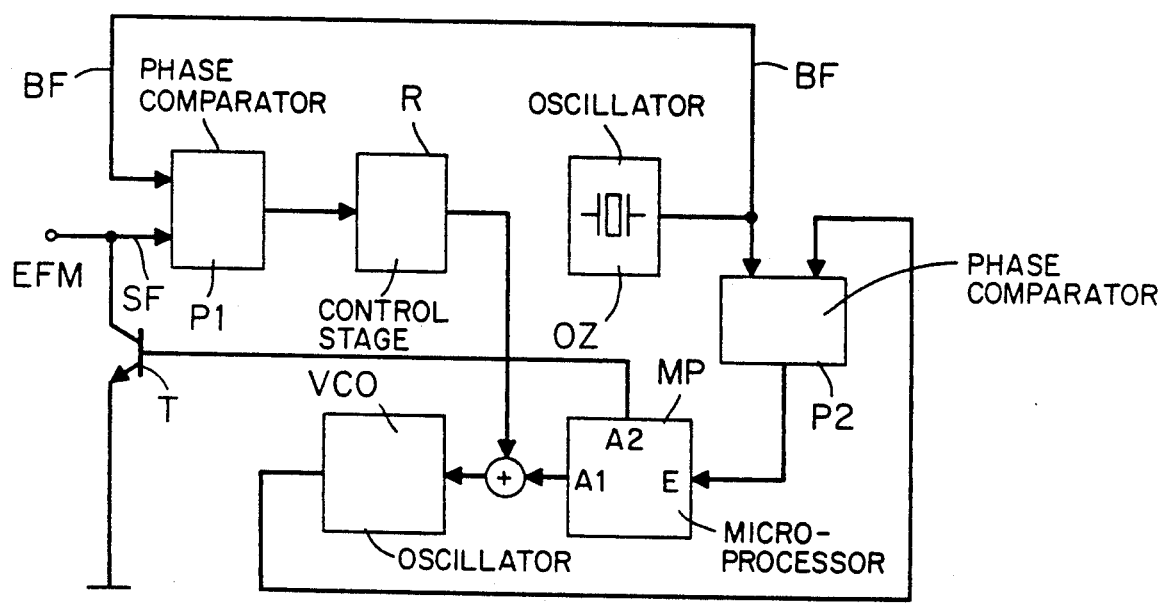
FIG. 4 is a schematic block diagram showing the essential elements of a fourth embodiment of the invention.

The first input terminal of the phase comparator P1 illustrated in FIG. 4 obtains reference potential by way of the collector-emitter section of a transistor T, the base of which is connected to the output terminal A2 of microprocessor MP. While the loop is being compensated, the input terminal of phase comparator P1 is drawn to reference potential by transistor T. Since the resistance of the output terminal of control stage R accordingly becomes high, the stage will no longer affect the loop. When transistor T is blocked on the other hand, control stage R is active because the resistance of its output terminal is low.

What is claimed is:

1. A phase control circuit comprising: a first phase comparator having a first input and a second input; a source of input frequency connected to said first input of said first comparator; a source of reference frequency connected to said second input of said first phase comparator; said first phase comparator having an output comparing said input frequency with said reference frequency; a first control stage with input connected to the output of said first phase comparator; a controlled oscillator with input connected to an output of said first control stage; a second control stage with output connected to the input of said oscillator; a second phase comparator with first input connected to an output of said oscillator; said second phase comparator having a second input connected to said source of reference frequency; said second control stage having an input connected to an output of said second phase comparator, said first control stage being separated from said oscillator to provide automatic compensation for the phase control circuit; said second control stage having an output varying until the frequency at the output of said oscillator equals the reference frequency; said output of said second control stage retaining a level corresponding to when the oscillator output frequency equals the reference frequency subsequent to compensation independent of the output from said second phase comparator and subsequent to reconnecting said first control stage to the input of said oscillator.

2. A phase control circuit as defined in claim 1, wherein said source of reference frequency comprises a quartz oscillator having an output connected to said second input of said first phase comparator, said output of said quartz oscillator being also connected to said second input of said second phase comparator; said second control stage having a first output connected to the input of said controlled oscillator; a controlled switch for deactivating said first control stage, said second control stage having a second output connected to a control input of said controlled switch.

3. A phase control circuit as defined in claim 2, wherein said controlled switch is connected between said first control stage and said controlled oscillator, said second control stage opening said controlled switch to compensate the phase control circuit and closing said switch after the circuit has been compensated.

4. A phase control circuit as defined in claim 1, including a compact disk player with a disk drive; an optical scanner for scanning a compact disk on said compact disk player and generating a data signal; means for generating an EFM signal from said data signal and supplying said EFM signal as said input frequency to said first input of said first phase comparator; the output of said controlled oscillator supplying a synchronized signal for controlling the drive of said compact disk player.

5. A phase control circuit as defined in claim 4, wherein said phase control circuit is compensated whenever said compact disk player is turned on to an operative state.

6. A phase control circuit as defined in claim 4, wherein said phase control circuit is always compensated before a compact disk is played.

7. A phase control circuit as defined in claim 4, wherein said phase control circuit is compensated when no data signal is being processed.

8. A phase control circuit as defined in claim 4, wherein said data signal has an error rate, said phase control circuit being compensated whenever said error rate of said data signal exceeds a predetermined threshold value.

9. A phase control circuit as defined in claim 4, wherein said phase control circuit is compensated whenever a data signal is absent.

10. A phase control circuit as defined in claim 4, wherein said phase control circuit is compensated when said optical scanner skips from one data track to another data track on said compact disk.

11. A phase control circuit as defined in claim 4, wherein said compact disk has recorded thereon pieces of music with a pause between two pieces of music, said phase control circuit being compensated during said pause between two pieces of music.

12. A phase control circuit as defined in claim 4, wherein said drive of said compact disk player has a speed established prior to compensation of said phase control circuit, the established speed being maintained throughout compensation of the circuit.

* * * * *